(12) United States Patent
Chiu et al.

(10) Patent No.: US 11,404,305 B1
(45) Date of Patent: Aug. 2, 2022

(54) MANUFACTURING METHOD OF ISOLATION STRUCTURES FOR SEMICONDUCTOR DEVICES

(71) Applicant: UNITED MICROELECTRONICS CORP., Hsin-Chu (TW)

(72) Inventors: Ta-Wei Chiu, Changhua County (TW); Shin-Hung Li, Nantou County (TW); Tsung-Yu Yang, Chiayi County (TW); Ruei-Jhe Tsao, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/210,494

(22) Filed: Mar. 23, 2021

(51) Int. Cl.
*H01L 21/762* (2006.01)
*H01L 21/311* (2006.01)
(52) U.S. Cl.
CPC .. *H01L 21/76224* (2013.01); *H01L 21/31105* (2013.01)
(58) Field of Classification Search
CPC ......... H01L 21/823462; H01L 27/0922; H01L 29/0649; H01L 21/762; H01L 21/76224; H01L 21/76229; H01L 21/76232; H01L 21/28158; H01L 21/823481; H01L 21/823878; H01L 21/027; H01L 21/0334; H01L 21/0274; H01L 21/30–32; H01L 21/308–3086; H01L 21/31051–31056; H01L 21/3213–32139; H01L 21/461–47576; H01L 21/30608; H01L 21/3065; H01L 21/311–31144
See application file for complete search history.

(56) References Cited

U.S. PATENT DOCUMENTS

| | | | |
|---|---|---|---|
| 6,420,240 B1 | 7/2002 | Yang | |
| 7,427,552 B2 * | 9/2008 | Jin | .......................... H01L 27/115 438/424 |
| 10,411,088 B2 | 9/2019 | Hsiung | |
| 2013/0344678 A1 * | 12/2013 | Oh | .................... H01L 21/76224 438/427 |

* cited by examiner

*Primary Examiner* — Sonya McCall-Shepard
(74) *Attorney, Agent, or Firm* — Winston Hsu

(57) ABSTRACT

A manufacturing method a semiconductor device includes the following steps. A first mask pattern and a second mask pattern are formed on a first region and a second region of a substrate respectively. The second region is located adjacent to the first region. A top surface of the first mask pattern is lower than a top surface of the second mask pattern in a thickness direction of the substrate. A trench is formed in the substrate. The trench is partly located in the first region and partly located in the second region. A first etching process is performed for reducing a thickness of the second mask pattern and reducing a height difference between the top surface of the first mask pattern and the top surface of the second mask pattern in the thickness direction of the substrate. An isolation structure is formed in the trench after the first etching process.

20 Claims, 13 Drawing Sheets

MANUFACTURING METHOD OF ISOLATION STRUCTURES FOR SEMICONDUCTOR DEVICES

BACKGROUND OF THE INVENTION

1. Field of the Invention

The present invention relates to a manufacturing method of a semiconductor device, and more particularly, to a manufacturing method of a semiconductor device including an isolation structure.

2. Description of the Prior Art

The development of semiconductor integrated circuit technology progresses continuously and circuit designs in products of the new generation become smaller and more complicated than those of the former generation. In some products, semiconductor devices having different threshold voltages and/or operation voltages are required in the integrated circuits, and the structures of the semiconductor devices may be different from one another for realizing different threshold voltages and/or operation voltages. For example, a relatively thicker gate oxide layer may be used to enhance the operation voltage of a semiconductor device in the relatively higher voltage area, and height differences between parts in the relatively higher voltage area and parts in the relatively lower voltage area may be generated accordingly. The height differences may cause problems in the related manufacturing processes and have negative influence on the manufacturing yield.

SUMMARY OF THE INVENTION

A manufacturing method a semiconductor device is provided in the present invention. A thickness of a relatively higher mask pattern is reduced by an etching process for reducing a height difference between top surfaces of different mask patterns, and the related process window and/or the manufacturing yield may be improved accordingly.

According to an embodiment of the present invention, a manufacturing method a semiconductor device is provided. The manufacturing method includes the following steps. A first mask pattern is formed on a first region of a substrate. A second mask pattern is formed on a second region of the substrate. The second region is located adjacent to the first region, and a top surface of the first mask pattern is lower than a top surface of the second mask pattern in a thickness direction of the substrate. A trench is formed in the substrate, and the trench is partly located in the first region and partly located in the second region. A first etching process is performed for reducing a thickness of the second mask pattern and reducing a height difference between the top surface of the first mask pattern and the top surface of the second mask pattern in the thickness direction of the substrate. An isolation structure is formed in the trench after the first etching process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-11 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10.

FIG. 12 and FIG. 13 are schematic drawings illustrating a manufacturing method of a semiconductor device according to a second embodiment of the present invention, wherein FIG. 13 is a schematic drawing in a step subsequent to FIG. 12.

DETAILED DESCRIPTION

Figure 1:
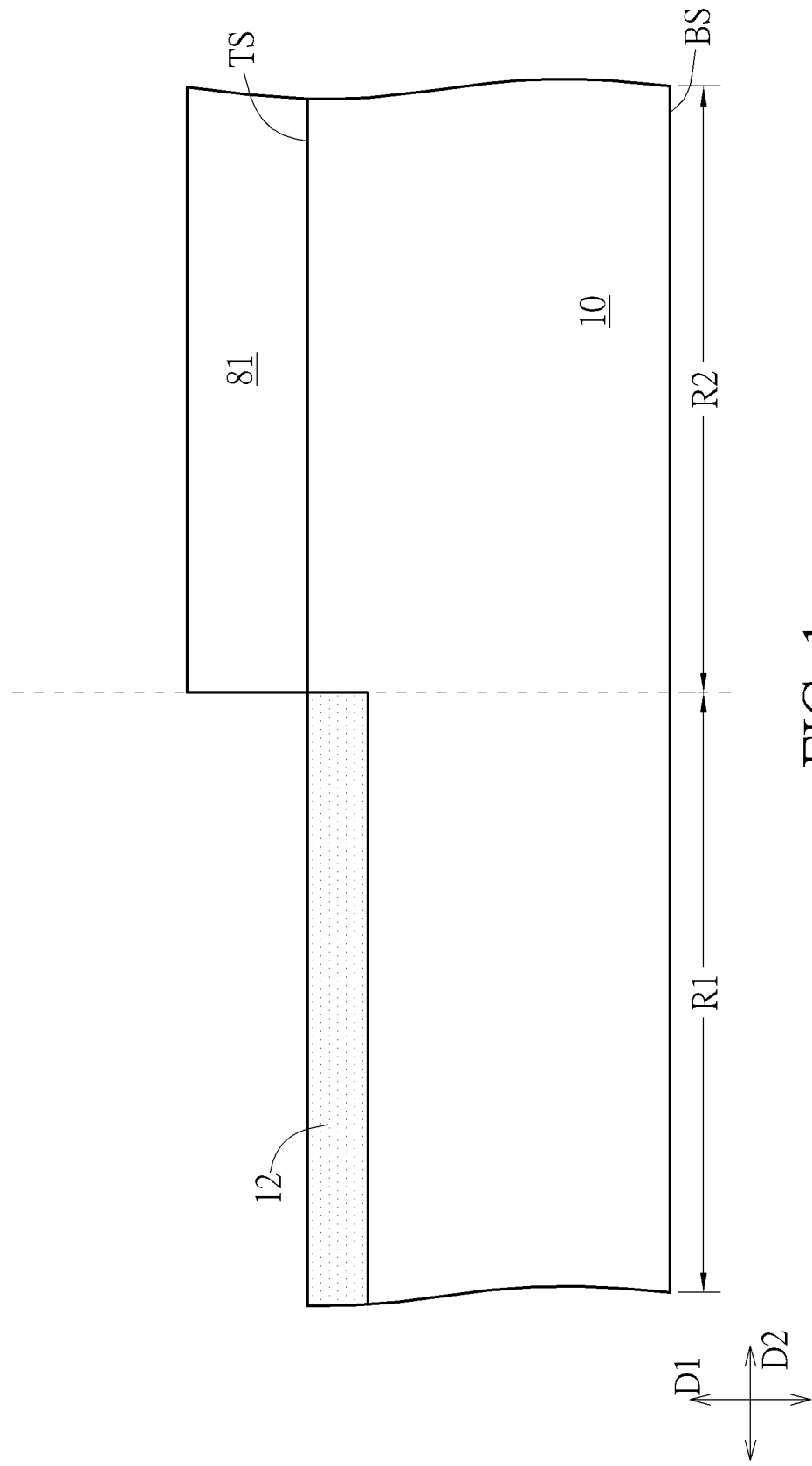

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the related art that the present invention can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

It should be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It should be understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 2:
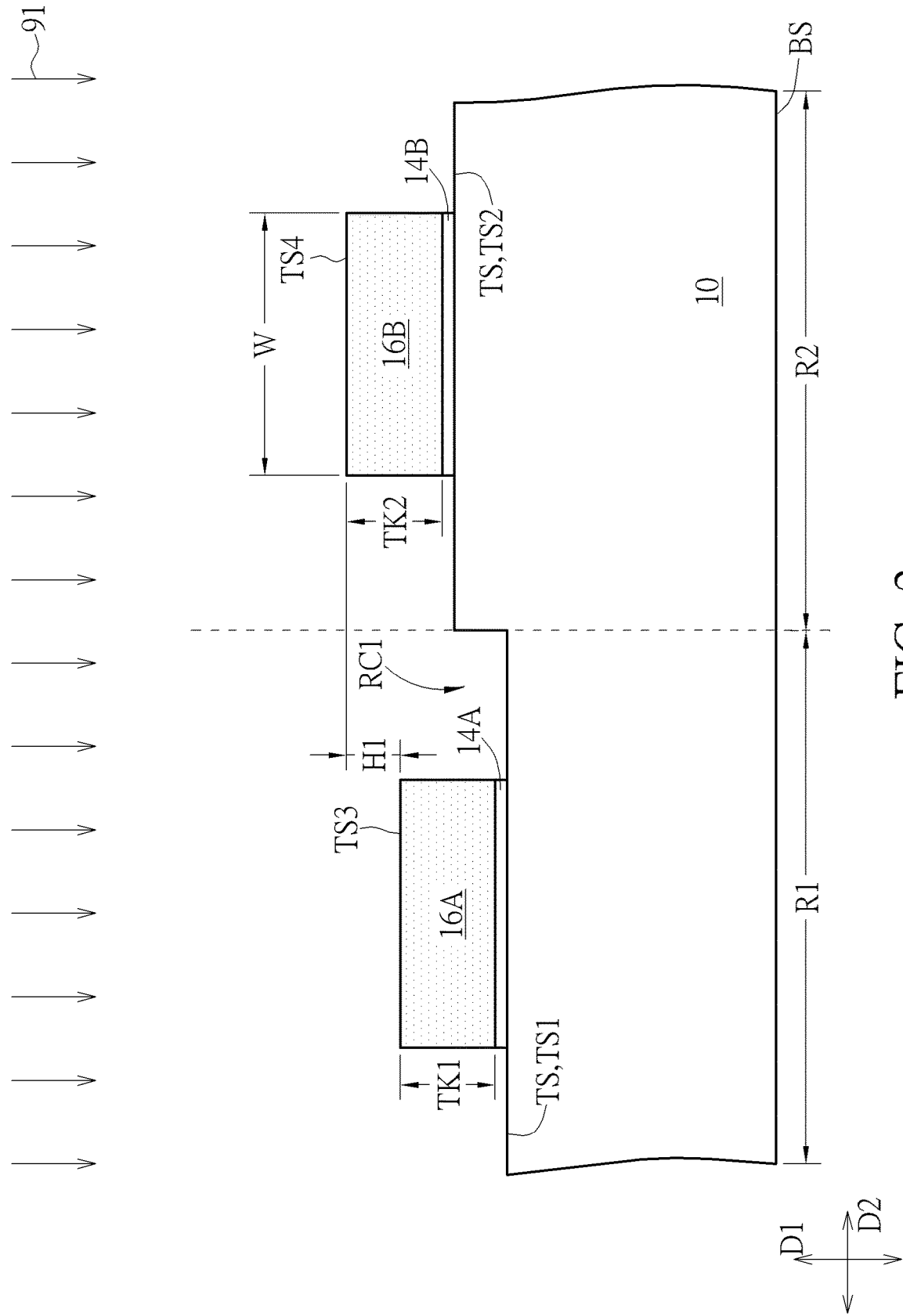
Figure 3:
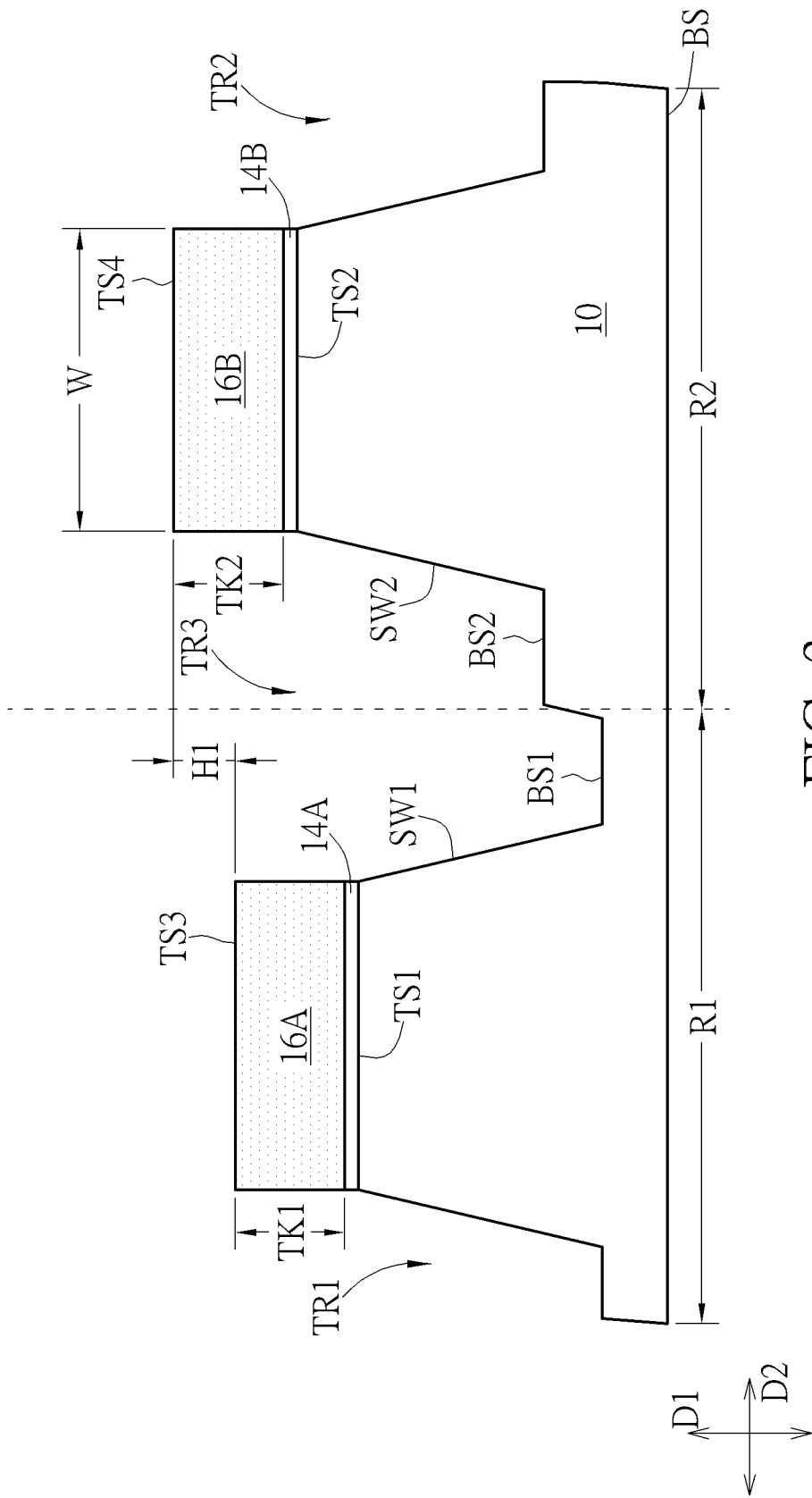
Figure 4:
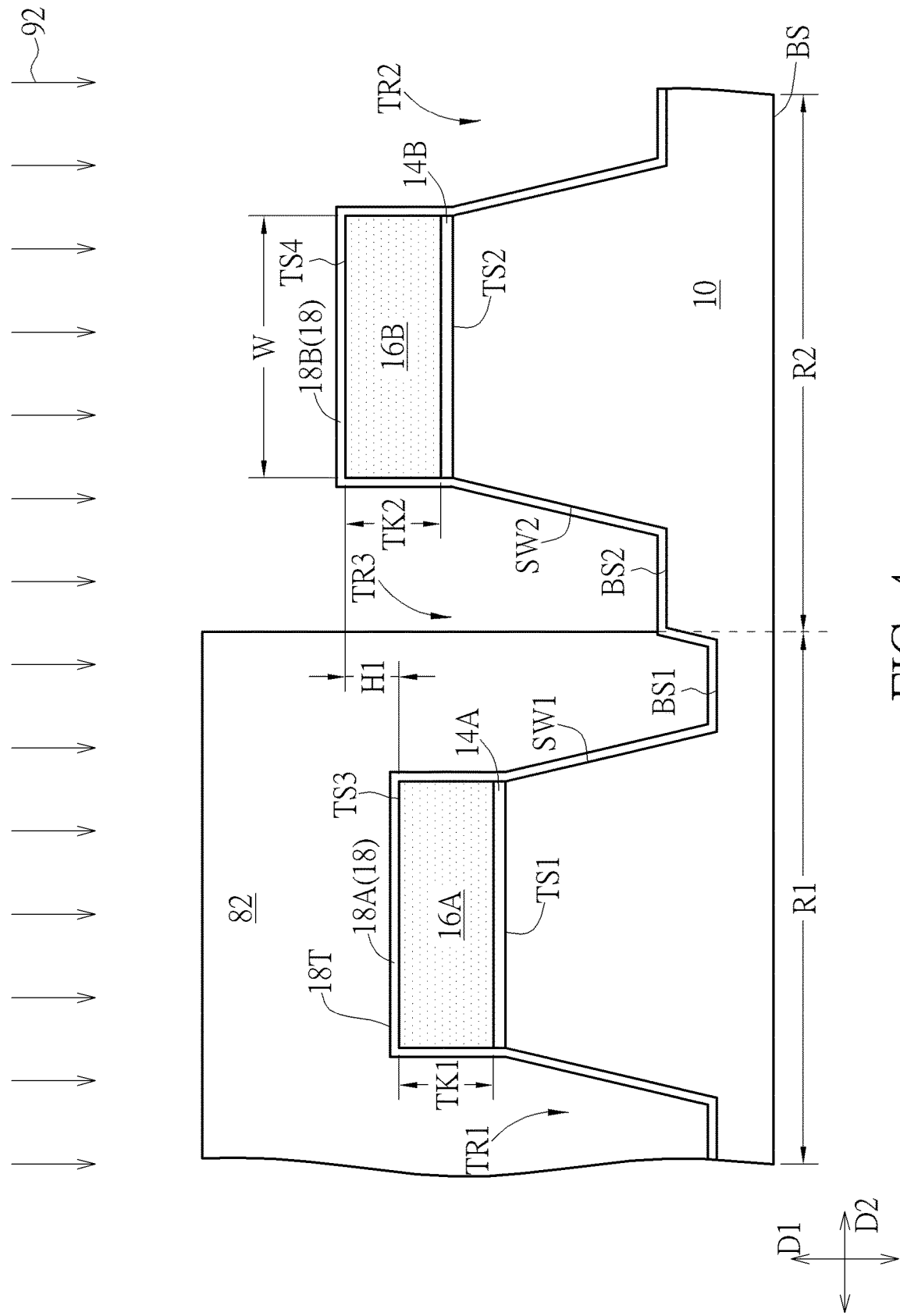
Figure 5:
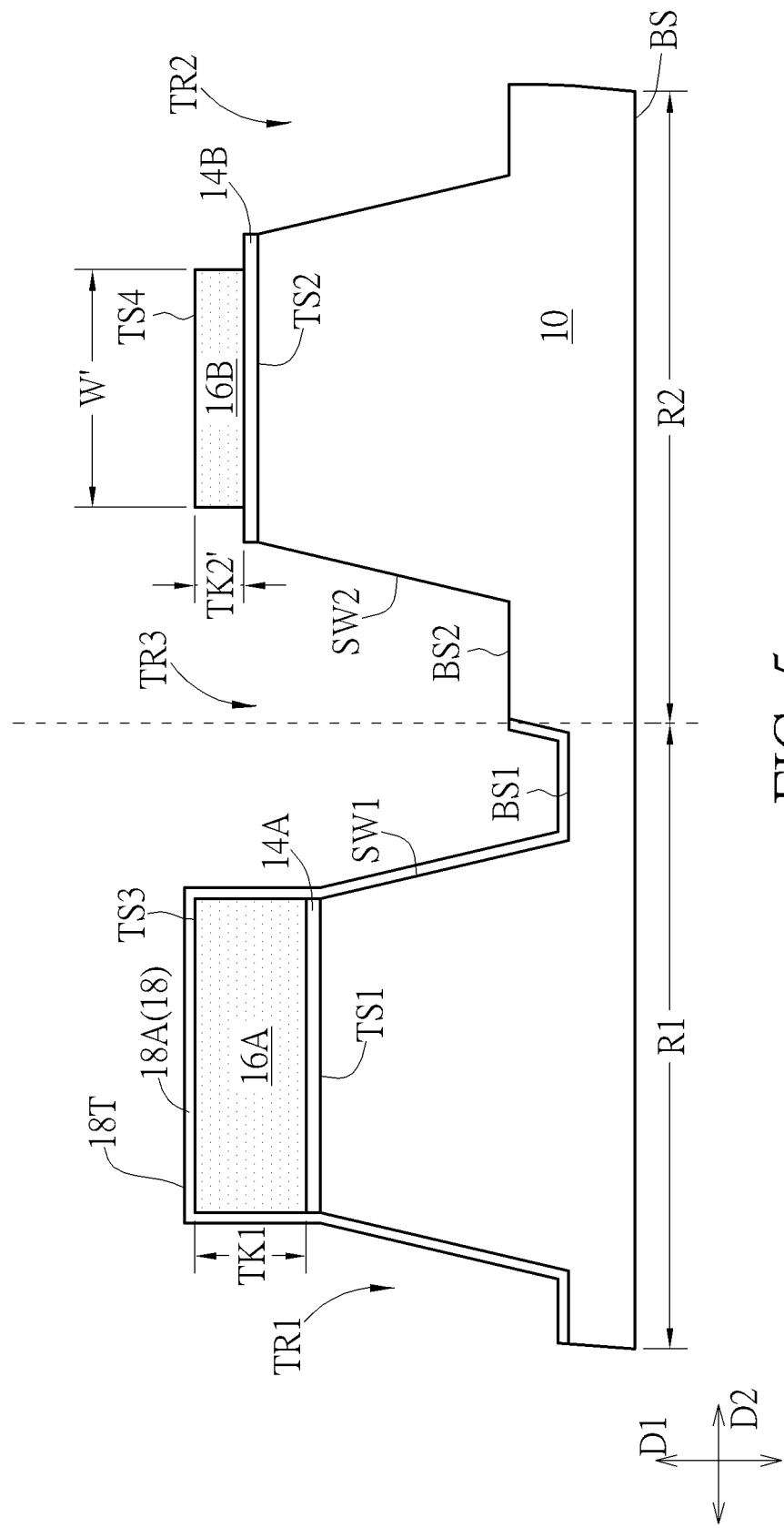
Figure 6:
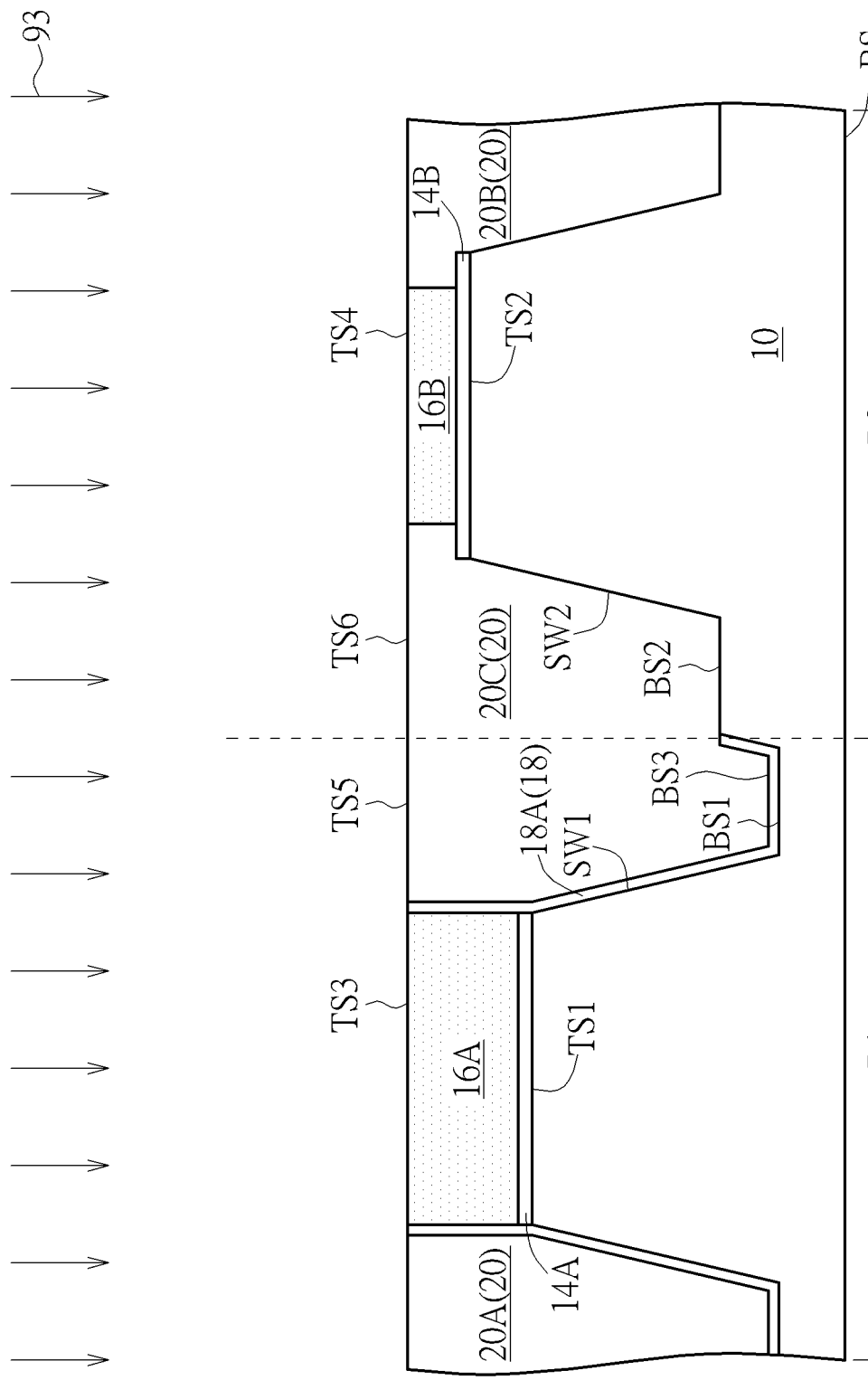
Figure 7:
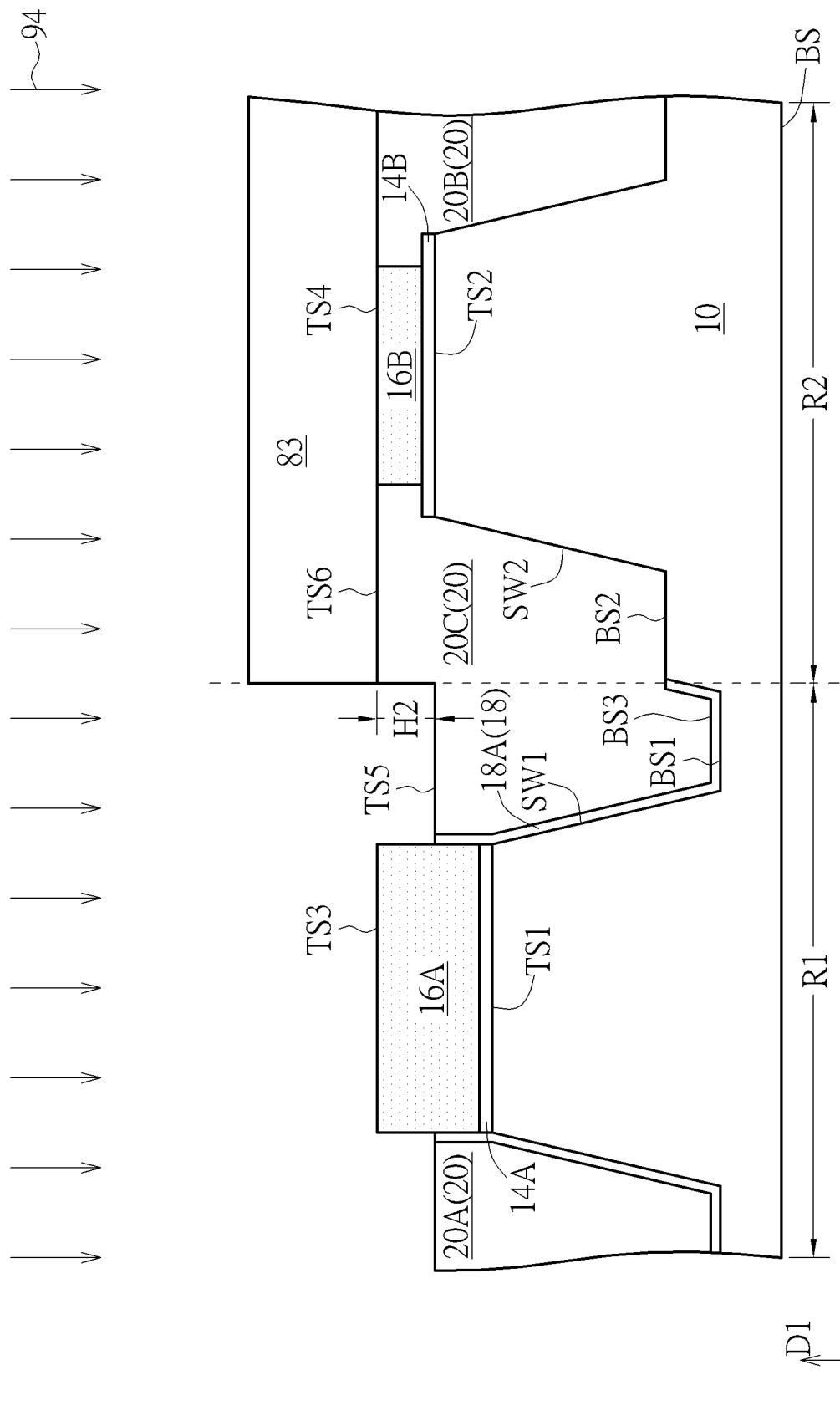
Figure 8:
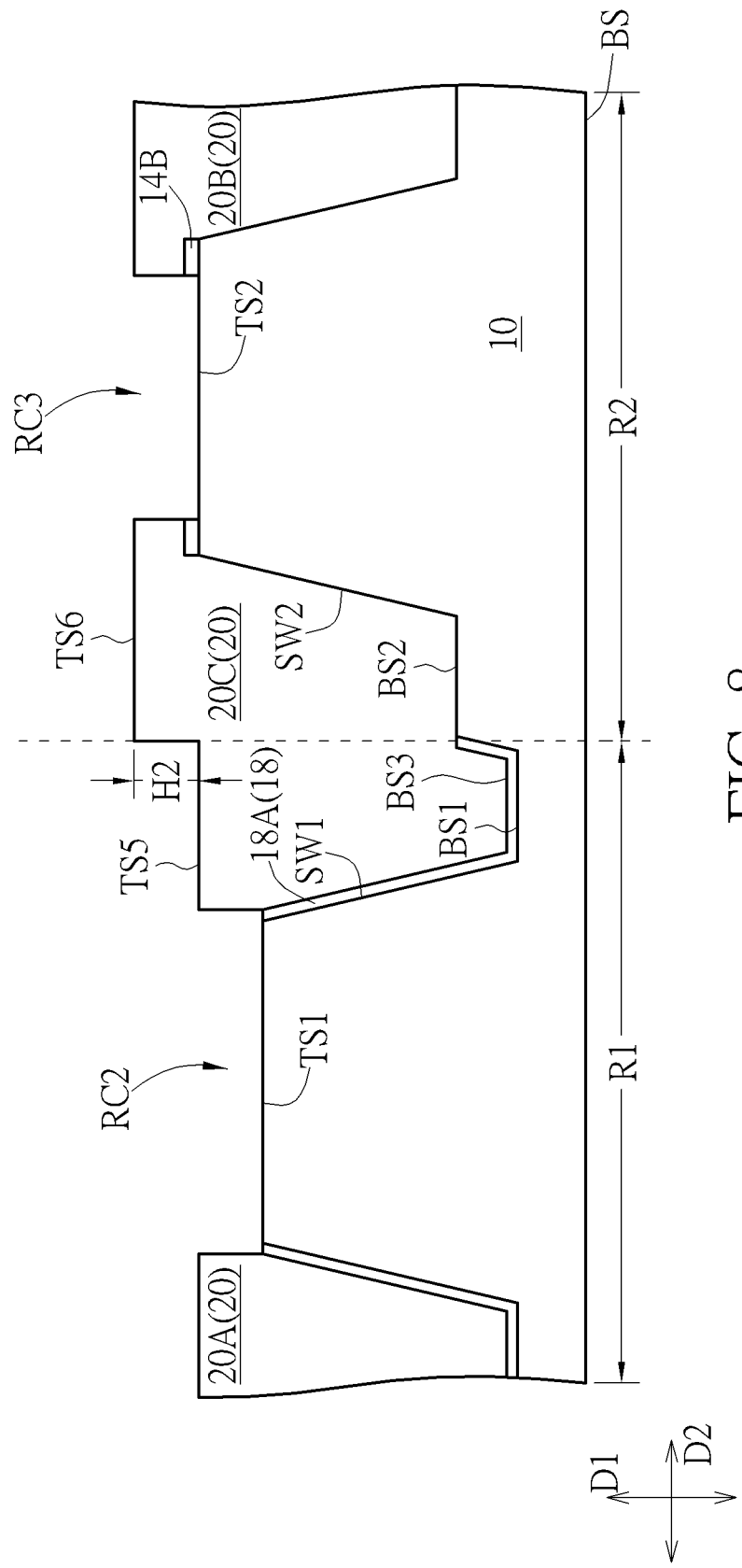
Figure 9:
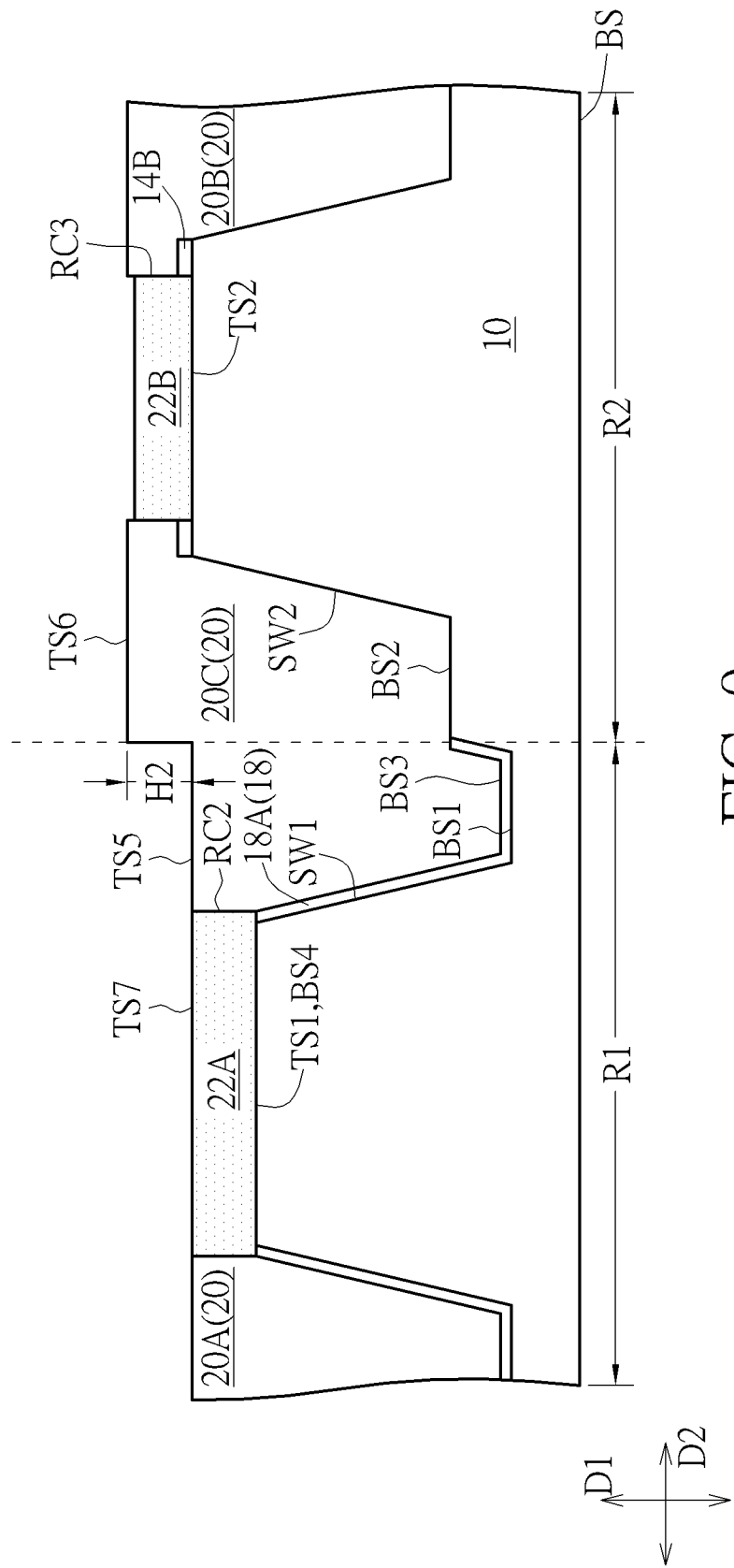
Figure 10:
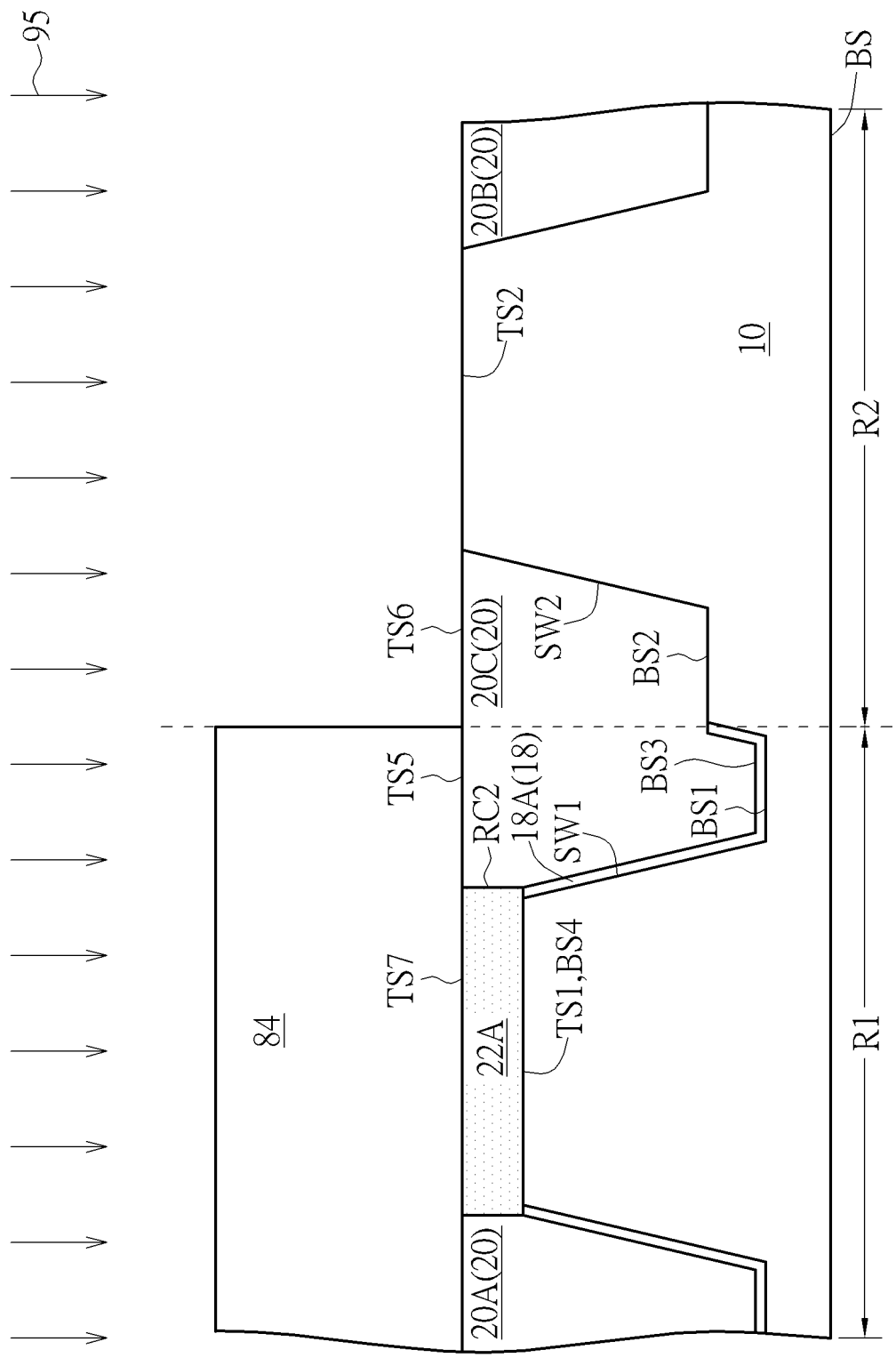
Figure 11:
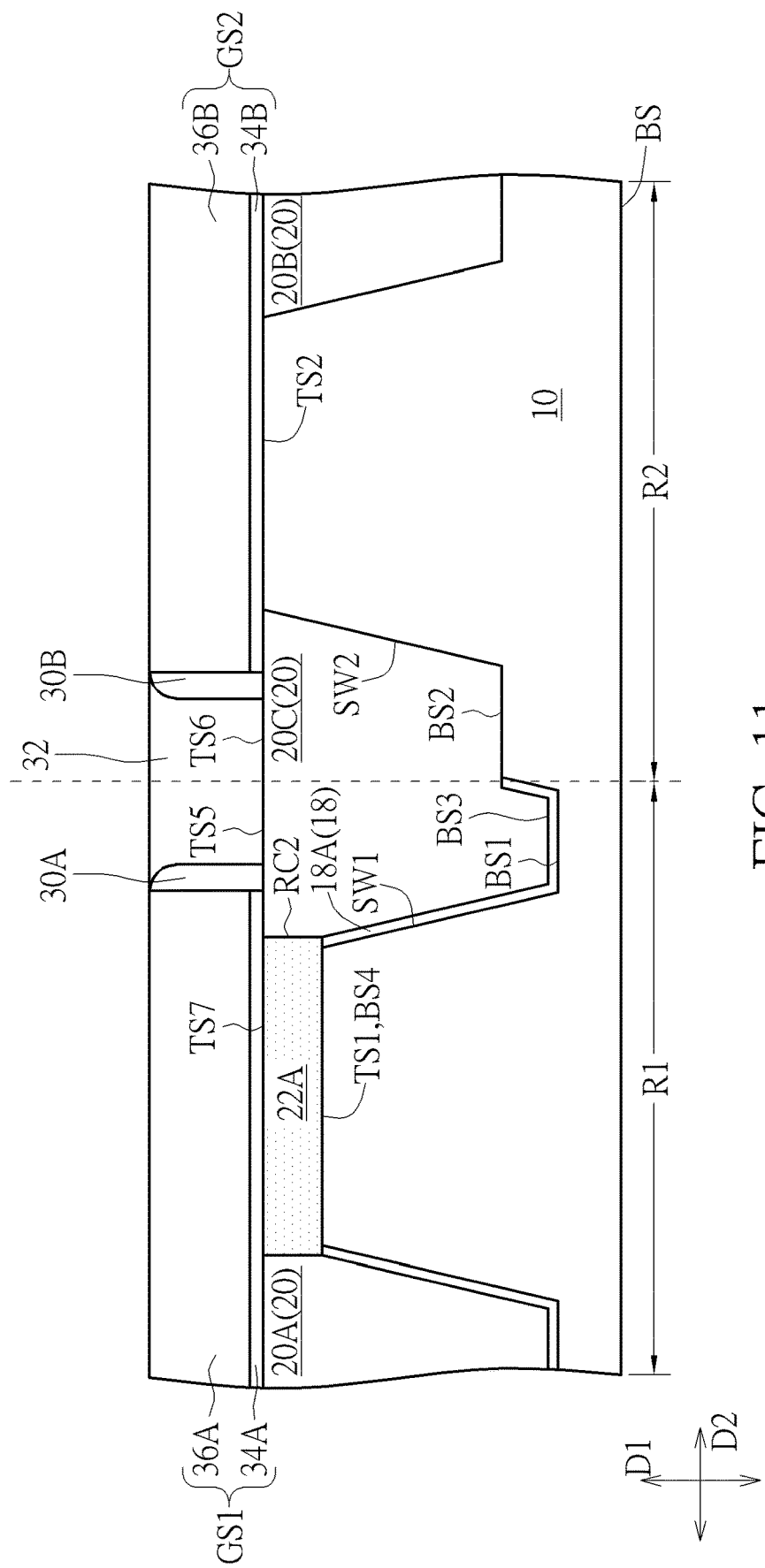

Please refer to FIGS. 1-11. FIGS. 1-11 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10. A manufacturing method of a semiconductor device is provided in this embodiment and includes the following steps. Firstly, as shown in FIG. 2, a first mask pattern 16A is formed on a first region R1 of a substrate 10, and a second mask pattern 16B is formed on a second region R2 of the substrate 10. In some embodiments, the second region R2 may be located adjacent to the first region R1, and the first region R1 and the second region R2 of the substrate 10 may be regarded as a first portion and a second portion of the substrate 10, respectively, but not limited thereto. A top surface of the first mask pattern 16A (such as a top surface TS3 shown in FIG. 2) may be lower than a top surface of the second mask pattern 16B (such as a top surface TS4 shown in FIG. 2) in a thickness direction of the substrate 10 (such as a first direction D1 shown in FIG. 2). As shown in FIG. 3, a trench TR3 is formed in the substrate 10, and the trench TR3 is partly located in the first region R1 and partly located in the second region R2. As shown in FIG. 4 and FIG. 5, a first etching process (such as an etching process 92 shown in FIG. 4) is performed for reducing a thickness of the second mask pattern 16B (such as a thickness TK2 shown in FIG. 4) and reducing a height difference H1 between the top surface TS3 of the first mask pattern 16A and the top surface TS4 of the second mask pattern 16B in the thickness direction of the substrate 10 (i.e. the first direction D1). As shown in FIGS. 4-6, an isolation structure 20C is formed in the trench TR3 after the etching process 92. The thickness of the relatively higher second mask pattern 16B may be reduced by the etching process 92 for reducing the height difference H1 between the top surface TS3 of the first mask pattern 16A and the top surface TS4 of the second mask pattern 16B before the step of forming the isolation structure 20C, the influence of the height difference H1 between the top surface TS3 of the first mask pattern 16A and the top surface TS4 of the second mask pattern 16B on the process of forming the isolation structure 20C and/or other subsequent manufacturing processes may be reduced, and the related process window and/or the manufacturing yield may be improved accordingly.

As shown in FIGS. 2-6, in some embodiments, the substrate 10 may have a top surface TS and a bottom surface BS opposite to the top surface TS in the first direction D1. The first mask pattern 16A and the second mask pattern 16B may be formed at a side of the top surface TS of the substrate 10, but not limited thereto. In addition, horizontal directions (such as a second direction D2 shown in FIGS. 2-6) substantially orthogonal to the first direction D1 may be substantially parallel with the top surface TS and/or the bottom surface BS of the substrate 10, but not limited thereto. Additionally, in this description, a distance between the bottom surface BS of the substrate 10 and a relatively higher location and/or a relatively higher part in the first direction D1 is greater than a distance between the bottom surface BS of the substrate 10 and a relatively lower location and/or a relatively lower part in the first direction D1. The bottom or a lower portion of each component may be closer to the bottom surface BS of the substrate 10 in the first direction D1 than the top or upper portion of this component. Another component disposed above a specific component may be regarded as being relatively far from the bottom surface BS of the substrate 10 in the first direction D1, and another component disposed under a specific component may be regarded as being relatively closer to the bottom surface BS of the substrate 10 in the first direction D1.

Specifically, the manufacturing method of the semiconductor device in the presented invention may include but is not limited to the following steps.

As shown in FIG. 1 and FIG. 2, before the step of forming the first mask pattern 16A and the second mask pattern 16B, a recess RC1 may be formed in the first region R1 of the substrate 10 for lowering the top surface of at least a portion of the first region R1 of the substrate 10. In some embodiments, a patterned mask layer 81 may be formed covering the top surface TS of the second region R2 of the substrate 10, and at least a portion of the first region R1 of the substrate 10 may be exposed accordingly. Subsequently, an oxidation process may be performed to the exposed portion of the first region R1 of the substrate 10 for forming an oxide layer 12, and the oxide layer 12 may be at least partially embedded in the substrate 10, but not limited thereto. In some embodiments, the patterned mask layer 81 may include photoresist or other suitable mask materials, and the substrate 10 may include a semiconductor substrate, such as a silicon substrate, a silicon germanium semiconductor substrate, a silicon-on-insulator (SOI) substrate, or a substrate made of other suitable materials. The oxidation process described above may include a thermal oxidation process, a chemical oxidation process, or other suitable oxidation approaches for oxidizing the exposed substrate 10 and forming the oxide layer 12. Subsequently, the patterned mask layer 81 and the oxide layer 12 may then be removed for forming the recess RC1 above the first region R1 of the substrate 10. Therefore, a top surface TS1 of the first region R1 may be lower than a top surface TS2 of the second region R2 in the first direction D1, and the top surface TS1 of the first region R1 may be regarded as a bottom surface of the recess RC1, but not limited thereto. It is worth noting that the method of lowering the top surface TS1 of the first region R1 is not limited to the steps described above and other methods capable of lowering the top surface TS1 of the first region R1 may also be applied in the present invention.

As shown in FIG. 2, the first mask pattern 16A and the second mask pattern 16B may be formed on the top surface TS1 of the first region R1 and the top surface TS2 of the second region R2, respectively, and the top surface TS1 of the first region R1 is lower than the top surface TS2 of the second region R2 in the first direction D1. In some embodiments, the first mask pattern 16A and the second mask pattern 16B may be formed by forming a mask material layer (not shown) on the first region R1 and the second region R2 and patterning the mask material layer to be the first mask pattern 16A on the first region R1 and the second mask pattern 16B on the second region R2. Therefore, the first mask pattern 16A may be separated from the second mask pattern 16B, a material composition of the first mask pattern 16A may be identical to a material composition of the second mask pattern 16B, and a thickness TK1 of the first mask pattern 16A may be substantially equal to the thickness TK2 of the second mask pattern 16B, but not limited thereto. In some embodiments, the first mask pattern 16A and the second mask pattern 16B may be formed by different processes and/or formed with different materials according to some design considerations. In some embodiments, the thickness TK1 of the first mask pattern 16A may be substantially equal to the thickness TK2 of the second mask pattern 16B with a tolerance of ±20% or ±10% because of influence of process variations. In other words, a ratio of the thickness TK1 to the thickness TK2 may range from 0.8 to 1.2 or range from 0.9 to 1.1, but not limited thereto. In some embodiments, the mask material layer described above may include nitride, such as silicon nitride, or other suitable mask materials.

Because the top surface TS1 of the first region R1 is lower than the top surface TS2 of the second region R2 in the first direction D1 and the first mask pattern 16A and the second mask pattern 16B are formed on the top surface TS1 of the first region R1 and the top surface TS2 of the second region R2, respectively, the top surface TS3 of the first mask pattern 16A may be lower than the top surface TS4 of the second mask pattern 16B in the first direction D1, especially when the thickness TK1 of the first mask pattern 16A is substantially equal to the thickness TK2 of the second mask pattern 16B, and the height difference H1 between the top surface TS3 of the first mask pattern 16A and the top surface TS4 of the second mask pattern 16B in the first direction D1 may exist accordingly. In some embodiments, a first pad oxide layer 14A may be disposed between the first mask pattern 16A and the first region R1 of the substrate 10, and a second pad oxide layer 14B may be disposed between the second mask pattern 16B and the second region R2 of the substrate 10. A projection shape and/or a projection area of the first pad oxide layer 14A may be substantially identical to that of the first mask pattern 16A, and a projection shape and/or a projection area of the second pad oxide layer 14B may be substantially identical to that of the second mask pattern 16B, but not limited thereto.

As shown in FIG. 2 and FIG. 3, an etching process 91 may be performed to the substrate 10 after the step of forming the first mask pattern 16A and the second mask pattern 16B, and the etching process 91 may be performed using the first mask pattern 16A and the second mask pattern 16B as a shielding mask for removing a part of the substrate 10 without being covered by the first mask pattern 16A and/or the second mask pattern 16B and forming trenches (such as a trench TR1, a trench TR2, and the trench TR3 shown in FIG. 3) in the substrate 10. In other words, the trench TR1, the trench TR2, and the trench TR3 may be formed by the etching process 91 using the first mask pattern 16A and the second mask pattern 16B as a shielding mask and performed to the substrate 10. The trench TR1 may be located in the first region R1, the trench TR2 may be located in the second region R2, and the trench TR3 may be partly located in the first region R1 and partly located in the second region R2. In some embodiments, the etching process 91 may include an anisotropic etching process, such as an anisotropic dry etching process, or other suitable etching approaches, the bottom and/or a bottom surface of the trench TR1 may be lower than that of the trench TR2 in the first direction D1, and the bottom and/or a bottom surface BS1 of the trench TR3 located in the first region R1 is lower than the bottom and/or a bottom surface BS2 of the trench TR3 located in the second region R2 in the first direction D1 because the top surface TS1 of the first region R1 is lower than the top surface TS2 of the second region R2 in the first direction D1. It is worth noting that, in some embodiments, the top surface of the specific component described above and/or described in the following contents may be the topmost surface of the specific component in the first direction D1, and the bottom surface of the specific component described above and/or described in the following contents may be the bottommost surface of the specific component in the first direction D1, but not limited thereto.

As shown in FIG. 4 and FIG. 5, the etching process 92 may be performed for reducing the thickness TK2 of the second mask pattern 16B and reducing the height difference H1 between the top surface TS3 of the first mask pattern 16A and the top surface TS4 of the second mask pattern 16B in the first direction D1. In some embodiments, the thickness TK2 of the second mask pattern 16B may be reduced to be a thickness TK2' less than the thickness TK1 of the first mask pattern 16A after the etching process 92, and the height difference H1 between the top surface TS3 of the first mask pattern 16A and the top surface TS4 of the second mask pattern 16B in the first direction D1 may be reduced to be less than or equal to 30 angstroms after the etching process 92, but not limited thereto. In some embodiments, a patterned mask layer 82 may be formed covering the first mask pattern 16A and the first region R1 of the substrate 10 before the etching process 92, and the first mask pattern 16A may be covered by the patterned mask layer 82 in the etching process 92 for avoiding damage to the first mask pattern 16A in the etching process 92. The patterned mask layer 82 may include photoresist or other suitable mask materials, and the patterned mask layer 82 may be removed after etching process 92. The etching process 92 may include a dry etching process, a wet etching process, or other suitable etching approaches. In addition, a width W of the second mask pattern 16B may be reduced to be a width W' by the etching process 92 also, and the width W' of the second mask pattern 16B may be less than that of the second pad oxide layer 14B after the etching process 92, but not limited thereto. In some embodiments, the width described above may be regarded as a length in a horizontal direction, and a length of the second mask pattern 16B in the second direction D2 may be less than that of the second pad oxide layer 14B accordingly.

In some embodiments, a liner layer 18 may be formed conformally on the first mask pattern 16A, the second mask pattern 16B, the first pad oxide layer 14A, the second pad oxide layer 14B, and a surface of the trench TR3 (such as the bottom surface BS1, the bottom surface BS2, a sidewall SW1, and a sidewall SW2 shown in FIG. 4) before the etching process 92 and the step of forming the patterned mask layer 82. In some embodiments, the liner layer 18 may be globally formed on the substrate 10, a first portion 18A of the liner layer 18 may be located on the first region R1, and a second portion 18B of the liner layer 18 may be located on the second region R2. The material composition of the liner layer 18 may be different from the material composition of the second mask pattern 16B, the material composition of the first mask pattern 16A, and the material composition of the substrate 10 for providing the required etching selectivity in subsequent processes. For example, the liner layer 18 may be an oxide layer, and the second mask pattern 16B may be a nitride pattern, but not limited thereto. In some embodiments, the liner layer 18 may be used as an etching mask in the process for trimming the second mask pattern 16B (such as a portion of the etching process 92 described above) and/or improving the adhesion of the patterned mask layer 82. For example, in some embodiments, the etching process 92 may include a first etching step and a second etching step performed after the first etching step. The first etching step may be used for removing the liner layer 18 on the second mask pattern 16B (such as the second portion 18B of the liner layer 18 on the second region R2), and the second etching step may be used for reducing the thickness TK2 of the second mask pattern 16B and reducing the height difference H1 between the top surface TS3 of the first mask pattern 16A and the top surface TS4 of the second mask pattern 16B in the first direction D1. In some embodiments, the first etching step and the second etching step of the etching process 92 may be carried out in different process chambers and/or different etching apparatuses respectively for avoiding contamination from the patterned mask layer 82, and the patterned mask layer 82 may be removed before the second etching step.

In some embodiments, the liner layer 18 may be relatively thinner (such as being thinner than the first mask pattern 16A and the second mask pattern 16B) for reducing the loading of the process for removing the second portion 18B of the liner layer 18 (such as the first etching step described above), and the top surface TS4 of the second mask pattern 16B may be higher than a top surface 18T of the liner layer 18 on the first mask pattern 16A before the etching process 92. In addition, the top surface TS4 of the second mask pattern 16B and the top surface TS3 of the first mask pattern 16A may be substantially located at the same level in the first direction and/or substantially located in the same plane orthogonal to the first direction D1 after the etching process 92, preferably. Therefore, the top surface TS4 of the second mask pattern 16B may be lower than the top surface 18T of the liner layer 18 on the first mask pattern 16A after the etching process 92, but not limited thereto.

As shown in FIG. 5 and FIG. 6, an isolation structure 20A, an isolation structure 20B, and the isolation structure 20C may be formed in the trench TR1, the trench TR2, and the trench TR3, respectively. The isolation structure 20C may be partly located in the first region R1 and partly located in the second region R2, and a bottom surface BS3 of the isolation structure 20C located in the first region R1 may be lower than a bottom surface of the isolation structure 20C located in the second region R2 (such as the bottom surface BS2 shown in FIG. 6). In some embodiments, the isolation structure 20A, the isolation structure 20B, and the isolation structure 20C may be formed by forming an insulation material 20 on the substrate 10 and performing a planarization process 93 to the insulation material 20, the first mask pattern 16A, and the second mask pattern 16B, but not limited thereto. The planarization process 93 may include a chemical mechanical polishing (CMP) process or other suitable planarization approaches, and the insulation material 20 may be a single layer structure or a multi-layer structure of insulation materials, such as oxide insulation materials (silicon oxide, for example), or other suitable insulation materials.

The trench TR1, the trench TR2, and the trenches TR3 may be filled with the insulation material 20, the insulation material 20 may be partly formed in the trenches and partly formed outside the trenches (such as covering the first mask pattern 16A and the second mask pattern 16B), and the planarization process 93 may be used to remove the insulation material 20 on the first mask pattern 16A and the second mask pattern 16B and the liner layer 18 on the first mask pattern 16A. Preferably, the top surface TS3 of the first mask pattern 16A, the top surface TS4 of the second mask pattern 16B, a top surface TS5 of the isolation structure 20C located in the first region R1, a top surface TS6 of the isolation structure 20C located in the second region R2, a top surface of the isolation structure 20A, and a top surface of the isolation structure 20B may be substantially coplanar and/or substantially located in the same plane orthogonal to the first direction D1 after the planarization process 93. The process loading of the planarization process 93 may be reduced and/or the planarization result of the planarization process 93 may be improved because the height difference between the top surface TS3 of the first mask pattern 16A and the top surface TS4 of the second mask pattern 16B is reduced before the planarization process 93, especially when the material composition of the isolation structure 20C (i.e. the material composition of the insulation material 20) is different from the material composition of the first mask pattern 16A and the material composition of the second mask pattern 16B, and the related process window and/or the manufacturing yield may be improved accordingly. In some embodiments, the height difference between the top surface TS3 of the first mask pattern 16A and the top surface TS4 of the second mask pattern 16B in the first direction D1 may be less than or equal to 30 angstroms before the planarization process 93 for achieving the effects described above, but not limited thereto. After the step of forming the isolation structure 20C, the liner layer 18 may be partly located between the isolation structure 20C and the substrate 10 and partly located between the isolation structure 20C and the first mask pattern 16A, and the isolation structure 20C located in the second region R2 may be directly connected with the substrate 10, the second pad oxide layer 14B, and the second mask pattern 16B.

As shown in FIGS. 6-9, in some embodiments, the manufacturing method may further include removing the first mask pattern 16A for forming a recess RC2 adjacent to the isolation structure 20C and forming an oxide layer 22A in the recess RC2. In some embodiments, the oxide layer 22A may be used as a gate oxide layer for a semiconductor device with a relatively higher operation voltage, the first region R1 may be regarded as a high voltage region, and the second region R2 may be regarded as a low voltage region, but not limited thereto. As shown in FIG. 6 and FIG. 7, in some embodiments, the manufacturing method may further include performing an etching process 94 for removing a part of the isolation structure 20C located in the first region R1 and a part of the isolation structure 20A located in the first region R1 before the step of removing the first mask pattern. In some embodiments, a patterned mask layer 83 may be formed on the second region R2 of the substrate 10 and cover the second mask pattern 16B, the isolation structure 20B, and the isolation structure 20C in the second region R2 before the etching process 94, and the second mask pattern 16B, the isolation structure 20B, and the isolation structure 20C in the second region R2 may be covered by the patterned mask layer 83 in the etching process 94. Therefore, the top surface TS5 of the isolation structure 20C in the first region R1 may become lower than the top surface TS6 of the isolation structure 20C in the second region R2 after the etching process 94, and a height difference H2 between the top surface TS5 of the isolation structure 20C in the first region R1 and the top surface TS6 of the isolation structure 20C in the second region R2 after the etching process 94. In some embodiments, a part of the liner layer 18 may be removed by the etching process 94, and a part of the sidewall of the first mask pattern 16A may be exposed after the etching process 94. In some embodiments, the patterned mask layer 83 may include photoresist or other suitable mask materials, and the patterned mask layer 83 may be removed after etching process 94. In some embodiments, the patterned mask layer 83 and the patterned mask layer 82 shown in FIG. 4 described above may be formed by using the same photomask and different type of photoresists (such as a positive type photoresist and a negative type photoresist) for reducing the related manufacturing cost, but not limited thereto.

As shown in FIGS. 7-9, in some embodiments, the first mask pattern 16A and the second mask pattern 16B may be removed for forming the recess RC2 above the first region R1 and a recess RC3 above the second region R2, respectively, before the step of forming the oxide layer 22A and after the etching process 94. The first mask pattern 16A and the second mask pattern 16B may be removed by the same process concurrently, especially when the material composition of the first mask pattern 16A is identical to that of the second mask pattern 16B, but not limited thereto. Subsequently, the oxide layer 22A and an oxide layer 22B may be formed in the recess RC2 and the recess RC3, respectively. In some embodiments, a bottom surface BS4 of the oxide layer 22A may be lower than the top surface TS5 of the isolation structure 20C located in the first region R1, and a top surface TS7 of the oxide layer 22A may be lower than the top surface TS6 of the isolation structure 20C located in the second region R2. In some embodiments, the oxide layer 22A and the oxide layer 22B may be formed concurrently by an oxidation process (such as a thermal oxidation process, but not limited thereto) or other suitable approaches, and the etching process 94 may be used to adjust the depth of the recess RC2 and the thickness of the oxide layer 22A formed in the recess RC2.

As shown in FIG. 9 and FIG. 10, in some embodiments, the manufacturing method may further include performing an etching process 95 for removing a part of the isolation structure 20C located in the second region R2 and reducing the height difference H2 between the top surface TS5 of the isolation structure 20C located in the first region R1 and the top surface TS6 of the isolation structure 20C located in the second region R2 after the step of forming the oxide layer 22A and the oxide layer 22B. In addition, a patterned mask layer 84 may be formed on the first region R1 of the substrate 10 and cover the first mask pattern 16A, the isolation structure 20A, and the isolation structure 20C in the first region R1 before the etching process 95, and the first mask pattern 16A, the isolation structure 20A, and the isolation structure 20C in the first region R1 may be covered by the patterned mask layer 84 in the etching process 95. Preferably, the top surface TS3 of the first mask pattern 16A, the top surface TS5 of the isolation structure 20C located in the first region R1, the top surface TS6 of the isolation structure 20C located in the second region R2, the top surface TS2 of the second region R2, the top surface of the isolation structure 20A, and the top surface of the isolation structure 20B may be substantially coplanar and/or substantially located in the same plane orthogonal to the first direction D1 after the etching process 94, and the second mask pattern 22B and the second pad oxide layer 14B may be removed by the etching process 95. In some embodiments, the patterned mask layer 84 may include photoresist or other suitable mask materials, and the patterned mask layer 84 may be removed after etching process 95.

As shown in FIG. 11, a gate structure GS1 and a gate structure GS2 may be formed on the first region R1 and the second region R2, respectively. In some embodiments, the gate structure GS1 may be regarded as a gate electrode of a semiconductor device with relatively higher operation voltage, and the gate structure GS2 may be regarded as a gate electrode of a semiconductor device with relatively lower operation voltage, but not limited thereto. In some embodiments, the gate structure GS1 may include a gate dielectric layer 34A and a gate material layer 36A disposed on the gate dielectric layer 34A, and the gate structure GS2 may include a gate dielectric layer 34B and a gate material layer 36B disposed on the gate dielectric layer 34B. The gate dielectric layer 34A and the gate dielectric layer 34B may include a high dielectric constant (high-k) dielectric material or other suitable dielectric materials, and the gate material layer 36A and the gate material layer 36B may include a non-metallic electrically conductive material (such as doped polysilicon) or a metallic electrically conductive material, such as a metal gate structure formed with a work function layer and a low electrical resistivity layer stacked with each other, but not limited thereto. In some embodiments, a spacer 30A and a spacer 30B may be located on the sidewall of the gate structure GS1 and the sidewall of the gate structure GS2, respectively, and a dielectric layer 32 may be located between the spacer 30A and the spacer 30B. The e spacer 30A, the spacer 30B, and the dielectric layer 32 may include a single layer structure or a multi-layer structure of insulation materials, such as silicon oxide, silicon nitride, silicon oxynitride, or other suitable insulation materials. In some embodiments, the gate structure GS1 and the gate structure GS2 may be formed concurrently by a replacement metal gate (RMG) process, and some process issues of the process of forming the gate structure GS1 and the gate structure GS2 (such as metal gate loss) may be improved because the flatness of the surface where the gate structure GS1 is formed and the surface where the gate structure GS2 is formed may be improved by the manufacturing method described above.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 12:
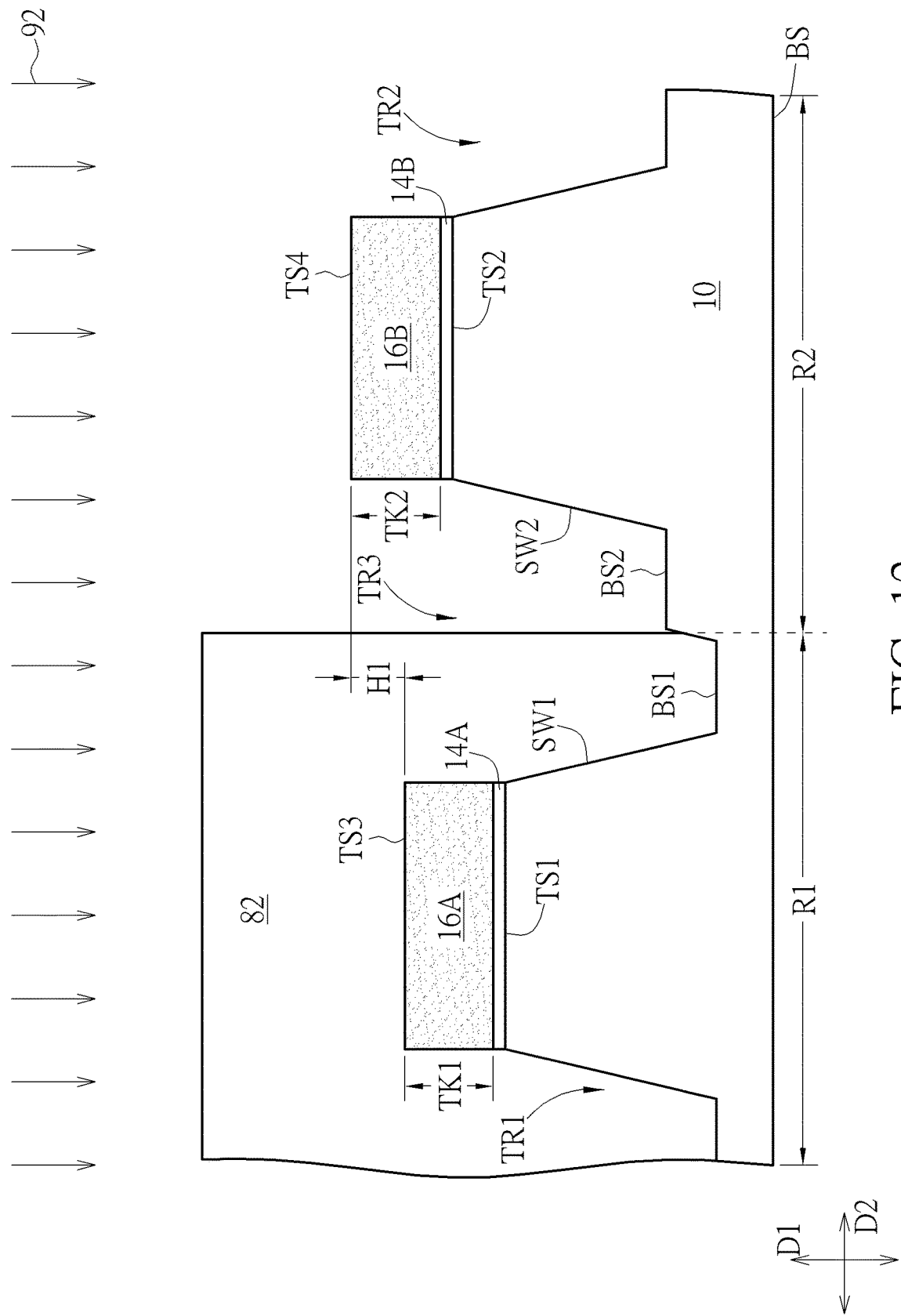
Figure 13:
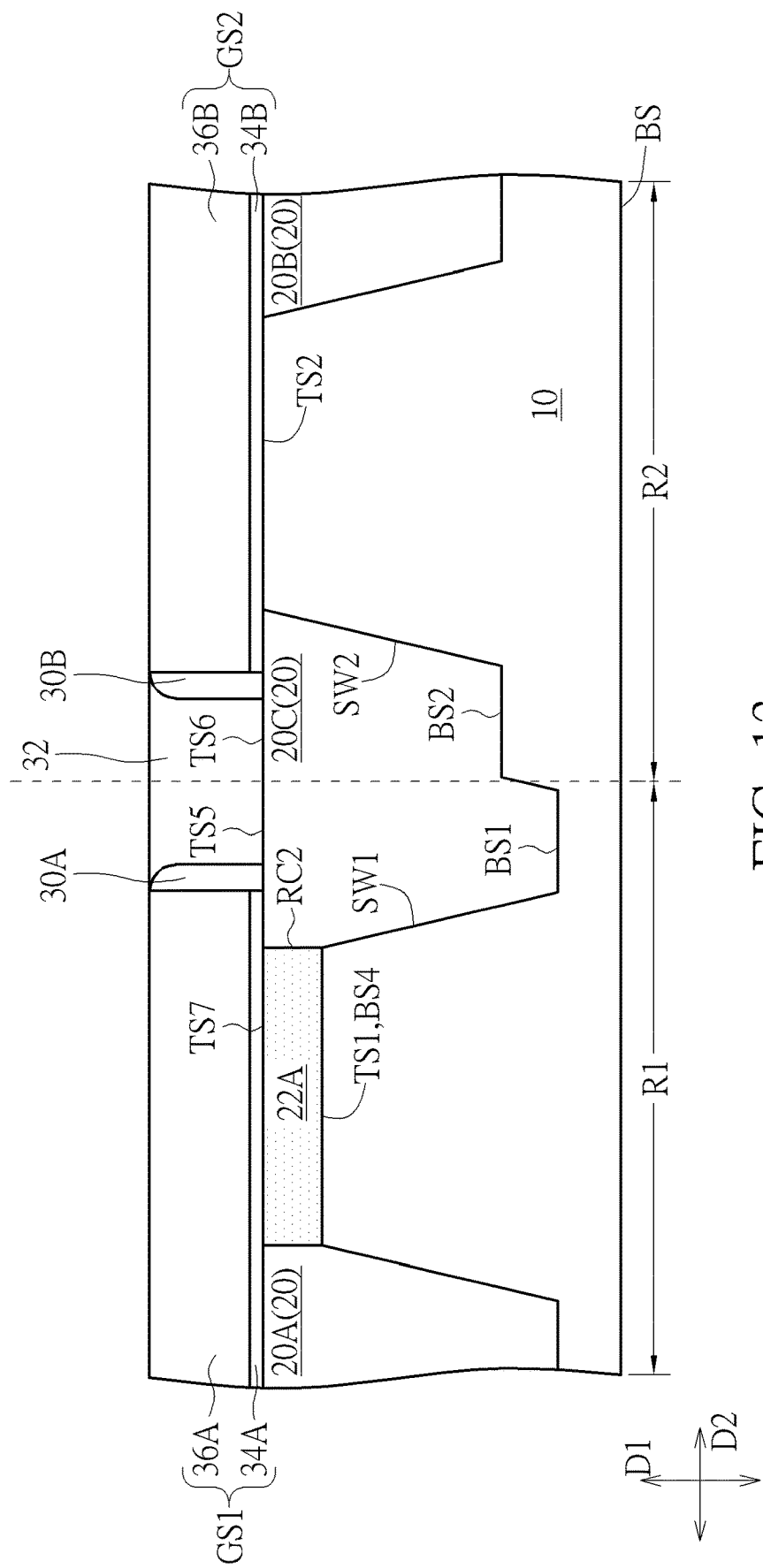

Please refer to FIGS. 12 and 13. FIG. 12 and FIG. 13 are schematic drawings illustrating a manufacturing method of a semiconductor device according to a second embodiment of the present invention, wherein FIG. 13 is a schematic drawing in a step subsequent to FIG. 12. As shown in FIG. 12, in some embodiments, the patterned mask layer 82 may directly contact the first mask pattern 16A, the first pad oxide layer 14A, and the first region R1 of the substrate 10 in the etching process 92. In other words, the etching process 92 may be carried out without using the liner layer described in the first embodiment of the present invention for simplifying the etching process 92 in some embodiments. Therefore, as shown in FIG. 13, the isolation structure 20C located in the first region R1 may be directly connected with the substrate 10 and the oxide layer, and the isolation structure 20C located in the second region R2 may be directly connected with the substrate 10.

To summarize the above descriptions, according to the manufacturing method of the semiconductor device in the present invention, the thickness of the relatively higher mask pattern may be reduced by the etching process before the step of forming the isolation structure for reducing the height difference between the top surfaces of different mask patterns. The related process window and/or the manufacturing yield may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
   forming a first mask pattern on a first region of a substrate;
   forming a second mask pattern on a second region of the substrate, wherein the second region is located adjacent to the first region, and a top surface of the first mask pattern is lower than a top surface of the second mask pattern in a thickness direction of the substrate;
   forming a trench in the substrate, wherein the trench is partly located in the first region and partly located in the second region;
   performing a first etching process for reducing a thickness of the second mask pattern and reducing a height difference between the top surface of the first mask pattern and the top surface of the second mask pattern in the thickness direction of the substrate; and
   forming an isolation structure in the trench after the first etching process.

2. The manufacturing method of the semiconductor device according to claim 1, wherein the trench is formed by an etching process using the first mask pattern and the second mask pattern as a shielding mask and performed to the substrate.

3. The manufacturing method of the semiconductor device according to claim 1, wherein the first mask pattern is covered by a patterned mask layer in the first etching process.

4. The manufacturing method of the semiconductor device according to claim 1, wherein the thickness of the second mask pattern is less than a thickness of the first mask pattern after the first etching process.

5. The manufacturing method of the semiconductor device according to claim 1, wherein the height difference between the top surface of the first mask pattern and the top surface of the second mask pattern in the thickness direction of the substrate is less than or equal to 30 angstroms after the first etching process.

6. The manufacturing method of the semiconductor device according to claim 1, wherein the first mask pattern is formed on a top surface of the first region, the second mask pattern is formed on a top surface of the second region, and the top surface of the first region is lower than the top surface of the second region in the thickness direction of the substrate.

7. The manufacturing method of the semiconductor device according to claim 1, wherein a bottom surface of the trench located in the first region is lower than a bottom surface of the trench located in the second region.

8. The manufacturing method of the semiconductor device according to claim 1, wherein the isolation structure is partly located in the first region and partly located in the second region, and a bottom surface of the isolation structure located in the first region is lower than a bottom surface of the isolation structure located in the second region.

9. The manufacturing method of the semiconductor device according to claim 1, further comprising:
   forming a liner layer conformally on the first mask pattern, the second mask pattern, and a surface of the trench before the first etching process.

10. The manufacturing method of the semiconductor device according to claim 9, wherein the first etching process comprises:
    a first etching step for removing the liner layer on the second mask pattern; and
    a second etching step performed after the first etching step for reducing the thickness of the second mask pattern and reducing the height difference between the top surface of the first mask pattern and the top surface of the second mask pattern.

11. The manufacturing method of the semiconductor device according to claim 9, wherein the top surface of the second mask pattern is higher than a top surface of the liner layer on the first mask pattern before the first etching process.

12. The manufacturing method of the semiconductor device according to claim 11, wherein the top surface of the second mask pattern is lower than the top surface of the liner layer on the first mask pattern after the first etching process.

13. The manufacturing method of the semiconductor device according to claim 9, wherein the liner layer is partly located between the isolation structure and the substrate and partly located between the isolation structure and the first mask pattern.

14. The manufacturing method of the semiconductor device according to claim 1, wherein the isolation structure is formed by forming an insulation material on the substrate and performing a planarization process to the insulation material, the first mask pattern, and the second mask pattern.

15. The manufacturing method of the semiconductor device according to claim 1, further comprising:
    removing the first mask pattern for forming a recess adjacent to the isolation structure; and
    forming an oxide layer in the recess, wherein the isolation structure is partly located in the first region and partly located in the second region, and a bottom surface of the oxide layer is lower than a top surface of the isolation structure located in the first region.

16. The manufacturing method of the semiconductor device according to claim 15, further comprising:
    performing a second etching process for removing a part of the isolation structure located in the first region before the step of removing the first mask pattern.

17. The manufacturing method of the semiconductor device according to claim 16, further comprising:
    removing the second mask pattern before the step of forming the oxide layer and after the second etching process.

18. The manufacturing method of the semiconductor device according to claim 16, wherein the top surface of the isolation structure located in the first region is lower than a top surface of the isolation structure located in the second region after the second etching process.

19. The manufacturing method of the semiconductor device according to claim 18, further comprising:
    performing a third etching process for removing a part of the isolation structure located in the second region and reducing a height difference between the top surface of the isolation structure located in the first region and the top surface of the isolation structure located in the second region after the step of forming the oxide layer.

20. The manufacturing method of the semiconductor device according to claim 1, wherein a material composition of the isolation structure is different from a material composition of the first mask pattern and a material composition of the second mask pattern.

\* \* \* \* \*